United States Patent [19]

Chiu et al.

[11] 4,335,506
[45] Jun. 22, 1982

[54] METHOD OF FORMING ALUMINUM/COPPER ALLOY CONDUCTORS

[75] Inventors: George T. Chiu, Wappingers Falls; Robert R. Joseph, Poughkeepsie; Gunars M. Ozols, Wappingers Falls, all of N.Y.

[73] Assignee: International Business Machines Corporation, Armonk, N.Y.

[21] Appl. No.: 175,102

[22] Filed: Aug. 4, 1980

[51] Int. Cl.³ .................. H01L 21/283; H01L 21/308
[52] U.S. Cl. ........................................ 29/591; 29/590; 156/643; 156/652; 156/656; 156/659.1; 156/665; 156/666; 204/192 E; 357/67
[58] Field of Search .................. 29/590, 591; 204/192 EC, 192 E; 156/643, 656, 665, 666, 652, 659.1

[56] References Cited

U.S. PATENT DOCUMENTS

| | | | |
|---|---|---|---|
| 3,615,951 | 10/1971 | Franco et al. | 156/656 |
| 3,654,108 | 4/1972 | Smith | 204/192 E |
| 3,725,309 | 4/1973 | Ames et al. | 29/590 |
| 3,873,361 | 3/1975 | Franco et al. | 427/259 |
| 3,879,840 | 4/1975 | Ames et al. | 29/589 |
| 3,881,884 | 5/1975 | Cook et al. | 156/656 |
| 3,918,149 | 11/1975 | Roberts | 29/591 |
| 3,994,793 | 11/1976 | Harvilchuck et al. | 204/164 |
| 4,004,044 | 1/1977 | Franco et al. | 204/192 E |

FOREIGN PATENT DOCUMENTS

| | | | |
|---|---|---|---|
| 52-36975 | 3/1977 | Japan | 29/591 |
| 54-125968 | 9/1979 | Japan | 29/591 |
| 55-98827 | 7/1980 | Japan | 156/656 |

OTHER PUBLICATIONS

Hatzakis, M. et al., *Forming a Sputter Etching Mask*, IBM Technical Disclosure Bulletin, 12 (11), Apr. 1970.
Schaible, P. M. et al., *Reactive Ion Etching of Aluminum and Aluminum Alloys in an RF Plasma Containing Halogen Species*, in J. Vacuum Sci. & Tech., 15 (2) pp. 334–337, Mar./Apr. 1978.
Schaible, P. M., et al., *Reactive Ion Etching of Aluminum and Aluminum Alloys*, IBM Tech. Disc. Bul. 21 (4), Sep. 1978.

Primary Examiner—L. Dewayne Rutledge
Assistant Examiner—Alan E. Schiavelli
Attorney, Agent, or Firm—Henry Powers

[57] ABSTRACT

Aluminum/copper alloy conductors are made by forming a patterned layer of copper on a layer of aluminum. The portion of the aluminum layer which is not protected by the copper layer is removed by reactive ion etching and the resulting structure is then heated to cause the copper to diffuse into, and alloy with the aluminum layer.

8 Claims, 6 Drawing Figures

METHOD OF FORMING ALUMINUM/COPPER ALLOY CONDUCTORS

BACKGROUND OF THE INVENTION

This invention relates generally to the formation of electrically conductive metal patterns and more particularly to the formation of aluminum/copper alloy conductor lands in integrated circuit manufacture.

In integrated circuit manufacture, metal interconnection systems of aluminum are employed. Copper in amounts of about 1 to 8 percent by weight is added to the aluminum in order to increase the electromigration resistance of the aluminum. In the past, layers of aluminum/copper alloys have been deposited and patterned either by lift-off techniques or by substractive wet etching. More recently, plasma etching techniques have been used to etch aluminum, for example, the reactive ion etching process described in U.S. Pat. No. 3,994,793. According to this process a silicon semiconductor wafer, having a layer of aluminum on a dielectric layer, is partially masked and the exposed aluminum is reactively ion etched in, for example, an atmosphere of $CCl_4$ and argon. in etching alloys of aluminum, such as aluminum/copper or aluminum/silicon it is mentioned in the patent that substrate heating is advantageous. In fact, when attempting to etch aluminum/copper alloys, substrate heating is needed in order to obtan a satisfactory etching process because without substrate heating a residue forms which stops the etching process before it is completed. This heating requires the equipment capability to heat the substrate which can be expensive or difficult to retrofit on existing equipment.

U.S. Pat. No. 3,918,149 describes the formation of aluminum/silicon ohmic contacts while avoiding the problem of dissolution of substrate silicon which can cause shorting of the contact by depositing an additional layer of silicon on the substrate followed by a layer of aluminum. The aluminum is patterned by photomask and wet etching and then the exposed silicon is removed by plasma etching with freon gas to which the aluminum layer is resistant so that it acts as an etch mask. The remaining aluminum and silicon are then homogenized by heating to form an aluminum/silicon alloy contact to the silicon substrate without substantial dissolution of substrate silicon.

BRIEF SUMMARY OF THE INVENTION

We have now found a process for forming aluminum/copper electromigration resistant interconnection metallurgy by a reactive ion etching process which does not require substrate heating.

In accordance with this invention there is provided a process for making aluminum/copper alloy electrical conductors on a substrate comprising forming a patterned layer of copper on a layer of aluminum. The portion of aluminum, which is not masked by the copper layer is removed by reactive ion etching in a chlorine containing atmosphere and the resulting structure is then heated to cause the copper to diffuse into, and alloy with the aluminum layer.

DETAILED DESCRIPTION

Figure 1:
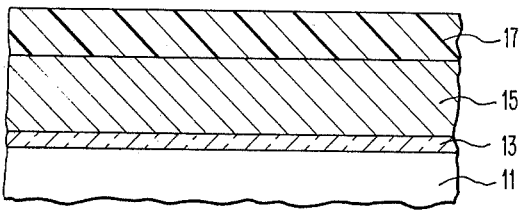
FIGS. 1-6 are schematic cross-sectional views illustrating the formation of an aluminum/copper conductor land according to a preferred embodiment of the process of the invention.
Figure 2:
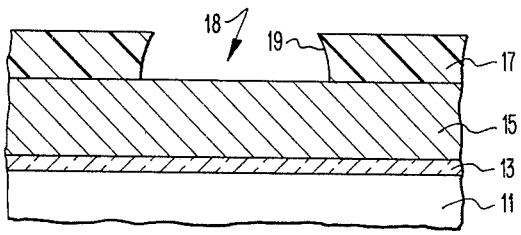
Figure 3:
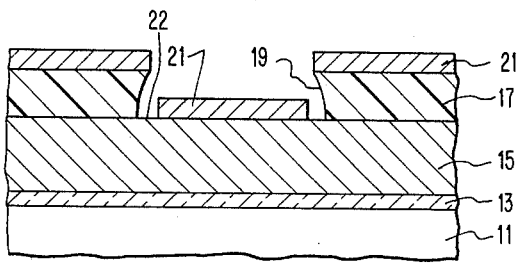
Figure 4:
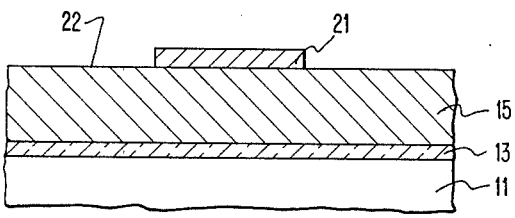

As shown in FIG. 1, a silicon semiconductor wafer substrate 11 containing semiconductor devices which are to be electrically connected into circuits and having a dielectric layer 13 of, for example, silicon dioxide or a combination of silicon dioxide and silicon nitride is placed in an evaporator and a layer of aluminum 15 is blanket deposited on dielectric layer 13 to a thickness of about 8500 angstroms. Layer thicknesses of aluminum conductor metallurgy usually range from about 8,000 to 14,000 angstroms. A resist layer 17 of a positive acting resist which is a mixture of phenol formaldehyde novolak resin and a diazo ketone sensitizer which comprise mixed 2-diazo-1-oxo-naphthalane-5-sulfonic acid estes of 2,3,4-trihydroxybenzophenone, is coated to a dry thickness of about 5,000 angstroms, prebaked at 85° C. for 15 minutes and then exposed patternwise to actinic light where the interconnection metallurgy conductor lines or lands are to be formed. Resist layer 17 is then soaked in chlorobenzene for about 5 minutes and then developed in dilute alkaline developer to remove the exposed portions of layer 17 and provide openings 18 with sidewalls 19 having a negative slope or lift-off profile, as shown in FIG. 2. A layer of copper 21 having a thickness of 360 angstroms plus or minus 40 angstroms which is sufficient to provide the amount of copper (2 to 4%) which is to be alloyed with the aluminum, is blanket evaporated onto the exposed surface 22 of aluminum layer 15 and over resist layers 17 (FIG. 3). It is found that a thickness of about 360 angstroms plus or minus 10% is needed to give a continuous copper layer without breaks or holes. For higher amounts of copper to be alloyed in the aluminum layer thicknesses of up to about 800 angstroms plus or minus 10% can be used with the exact amount chosen to give the amount of copper for the desired degree of electromigration resistance required in the aluminum conductor. Resist layer 17 is then removed along with the overlying copper by immersing in N-methyl pyrrolidone at a temperature of about 90° C. to leave a pattern of copper 21, corresponding to the desired interconnection pattern (FIG. 4). Other lift-off masks such as those described, for example, in U.S. Pat. No. 4,004,044 or a blanket deposited copper layer and subtractive etching with a pattern resist mask could also be employed in order to form the patterned copper layer.

Figure 5:
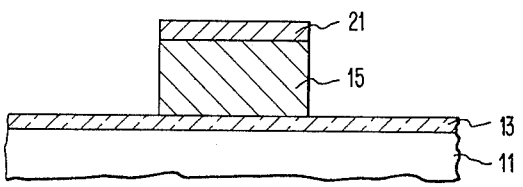
Figure 6:
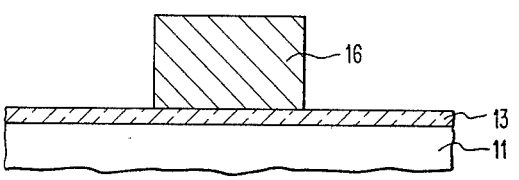

The exposed aluminum is then removed by placing the substrate at the cathode of a reactive ion etch chamber. Cathode heating is not required to give a satisfactory etch and the exposed portion of the aluminum layer is etched away with the cathode at ambient temperature in about 2 to 3 minutes in a glow discharge at a total RF power of about 180 watts (0.3 watts/cm$^2$ power density) and a pressure of about 4 microns in an atmosphere of $CCl_4$ to give the structure shown in FIG. 5. Other reactive ion etching process parameters within the scope described in U.S. Pat. No. 3,994,793 could also be employed. The resulting metal structure is then post-etch cleaned in the same chamber in a glow discharge of argon or other noble or inert gas at an RF power of about 180 watts (0.3 w/cm$^2$ power density) at a pressure of about 2 microns for about 30 to 60 seconds in order to remove residual chlorine compounds which could otherwise cause metal corrosion to occur. The substrate 11 having the composite aluminum and copper metallurgy layers is then placed in an oven and sintered at a temperature of about 400° C. in forming gas to drive the copper atoms into the aluminum layer. This forms a migration resistant aluminum/copper alloy layer 16 having a concentration of from aout 2 to 4 percent copper diffused throughout the aluminum (FIG. 6).

Although the copper layer has been used as a mask for the reactive ion etching step in the example it should be understood that other auxillary masking layers could be employed such as magnesium oxide or a resist layer used to pattern the copper in a subtractive etching process. The lift-off process for forming the copper layer is preferred for good line definition without undercut.

The process provides an electromigration resistant aluminum/copper alloy with the copper distributed throughout the aluminum land in which the aluminum lands are defined with straight sidewalls by employing reactive ion etching. The example shows forming the conductor lines on a semiconductor substrate but it could also be used to form alloy conductors for other applicators such as magnetic bubble devices or displays. The process does not require the heating previously used to etch and form aluminum/copper alloy conductor lands.

We claim:

1. A process for forming an aluminum/copper alloy, electromigration resistant electrical conductor comprising forming a patterned layer of copper on a layer of aluminum on a substrate, removing the auminum which is not masked by the patterned copper layer by reactive ion etching in a chlorine-containing atmosphere without supplementary heating of said substrate, and then heating to cause the copper to diffuse into and throughout said aluminum layer, and to alloy with the said aluminum layer.

2. The process of claim 1 wherein the layer of aluminum is formed by evaporation on a semiconductor substrate containing semiconductor devices.

3. The process of claim 1 wherein the patterned layer of copper is formed on the aluminum layer by a lift-off process.

4. The process of claim 1 wherein the copper layer is of a thickness to provide an aluminum/copper alloy containing 1-8 percent by weight copper when it is diffused into the aluminum layer.

5. The process of claim 1 wherein the aluminum is reactive in etched by placing the substrate on a cathode which is at ambient temperature.

6. The process of claim 5 wherein the aluminum is post reactive ion etch cleaned in a glow discharge of inert gas.

7. The process of claim 1 wherein the patterned layer of copper is formed by a substractive etch process.

8. The process of claim 5 wherein the patterned copper layer is used as an etch mask for reactive ion etching the aluminum.

* * * * *